(12) United States Patent
Stoneham

(10) Patent No.: US 7,710,219 B2
(45) Date of Patent: May 4, 2010

(54) MERGED-FILTER MULTIPLEXER

(75) Inventor: Edward B. Stoneham, Los Altos, CA (US)

(73) Assignee: Endwave Corporation, San Jose, CA (US)

( * ) Notice: Subject to any disclaimer, the term of this patent is extended or adjusted under 35 U.S.C. 154(b) by 121 days.

(21) Appl. No.: 12/039,536

(22) Filed: Feb. 28, 2008

(65) Prior Publication Data
US 2009/0219110 A1 Sep. 3, 2009

(51) Int. Cl.
H01P 5/12 (2006.01)
H03H 7/46 (2006.01)

(52) U.S. Cl. .................. 333/126; 333/129; 333/132; 333/134

(58) Field of Classification Search ......... 333/126–129, 333/132, 134
See application file for complete search history.

(56) References Cited

U.S. PATENT DOCUMENTS

| | | |
|---|---|---|
| 3,939,430 A | 2/1976 | Dickens et al. |
| 4,032,849 A | 6/1977 | Gysel et al. |
| 4,249,263 A | 2/1981 | Shinkawa et al. |
| 4,320,536 A | 3/1982 | Dietrich |
| 4,411,022 A | 10/1983 | Clifton et al. |
| 4,485,488 A | 11/1984 | Houdart |
| 4,542,535 A | 9/1985 | Bates et al. |
| 4,553,265 A | 11/1985 | Clifton et al. |
| 4,553,266 A | 11/1985 | Bates et al. |
| 4,607,394 A | 8/1986 | Nightingale |
| 4,739,519 A | 4/1988 | Findley |
| 4,955,079 A | 9/1990 | Connerney et al. |

(Continued)

FOREIGN PATENT DOCUMENTS

| | | |
|---|---|---|
| DE | 829318 | 1/1952 |
| WO | 97/10621 | 3/1997 |

OTHER PUBLICATIONS

Edward B. Stoneham, "High-Precision Flip-Chip Process Yields E-Band Harmonic with Potential Sub-10-dB Conversion Loss," Proceedings of the 36th European Microwave Conference, Sep. 2006, pp. 506-509.

(Continued)

Primary Examiner—Robert Pascal
Assistant Examiner—Kimberly E Glenn
(74) Attorney, Agent, or Firm—Kolisch Hartwell, PC

(57) ABSTRACT

A multiplexer circuit may include a first-frequency-quarter-wavelength transmission line extending between a junction between a common terminal and a second-frequency terminal, and a first-frequency low-impedance circuit electrically directly connecting the first transmission line to a circuit ground. In some examples, a second-frequency-quarter-wavelength transmission line may extend between the first transmission line and a third-frequency terminal. A second-frequency low-impedance circuit may electrically directly connect the second transmission line to the circuit ground. The first and second transmission lines and the first and second low-impedance circuits may provide a third-frequency transmission line. A further second-frequency low-impedance circuit may electrically couple the second terminal to the first transmission line. A third-frequency low-impedance circuit may electrically couple the second terminal to the circuit ground. The first-frequency, further second-frequency, and third-frequency low-impedance circuits and the first transmission line may provide in combination a second-frequency transmission line.

20 Claims, 4 Drawing Sheets

U.S. PATENT DOCUMENTS

| | | | | |
|---|---|---|---|---|
| 5,127,102 | A | * | 6/1992 | Russell ........................ 455/327 |
| 5,652,599 | A | | 7/1997 | Pitta et al. |
| 5,832,376 | A | | 11/1998 | Henderson et al. |
| 6,072,993 | A | * | 6/2000 | Trikha et al. ................... 455/78 |
| 6,608,534 | B2 | * | 8/2003 | Kushitani et al. ............ 333/126 |
| 7,146,136 | B2 | | 12/2006 | Consolazio |

OTHER PUBLICATIONS

World Intellectual Property Office (EPO as International Searching Authority, La Casta Munoa authorized official), "International Search Report and Written Opinion" for PCT/US2009/035014, mailing date May 25, 2009 (10 pages).

* cited by examiner

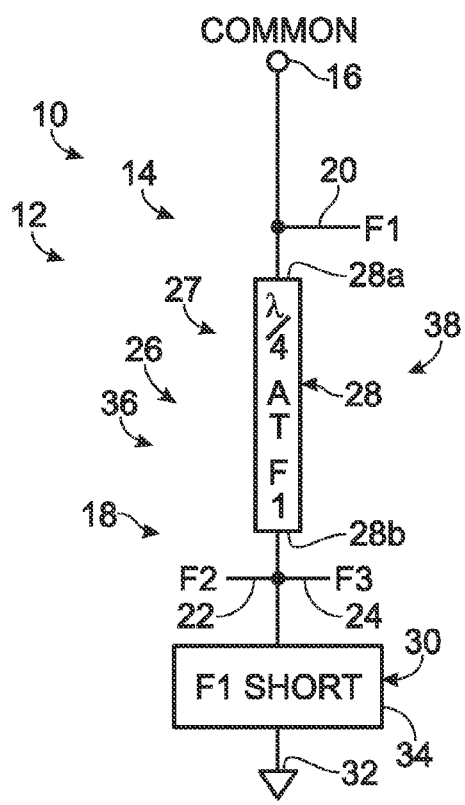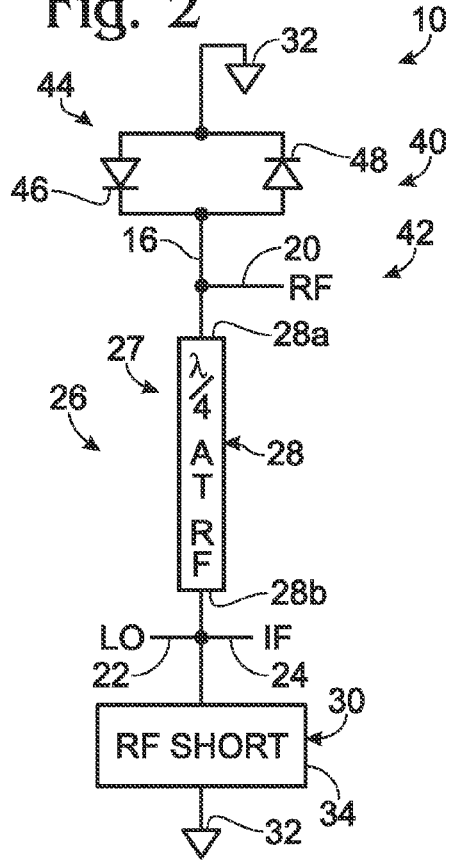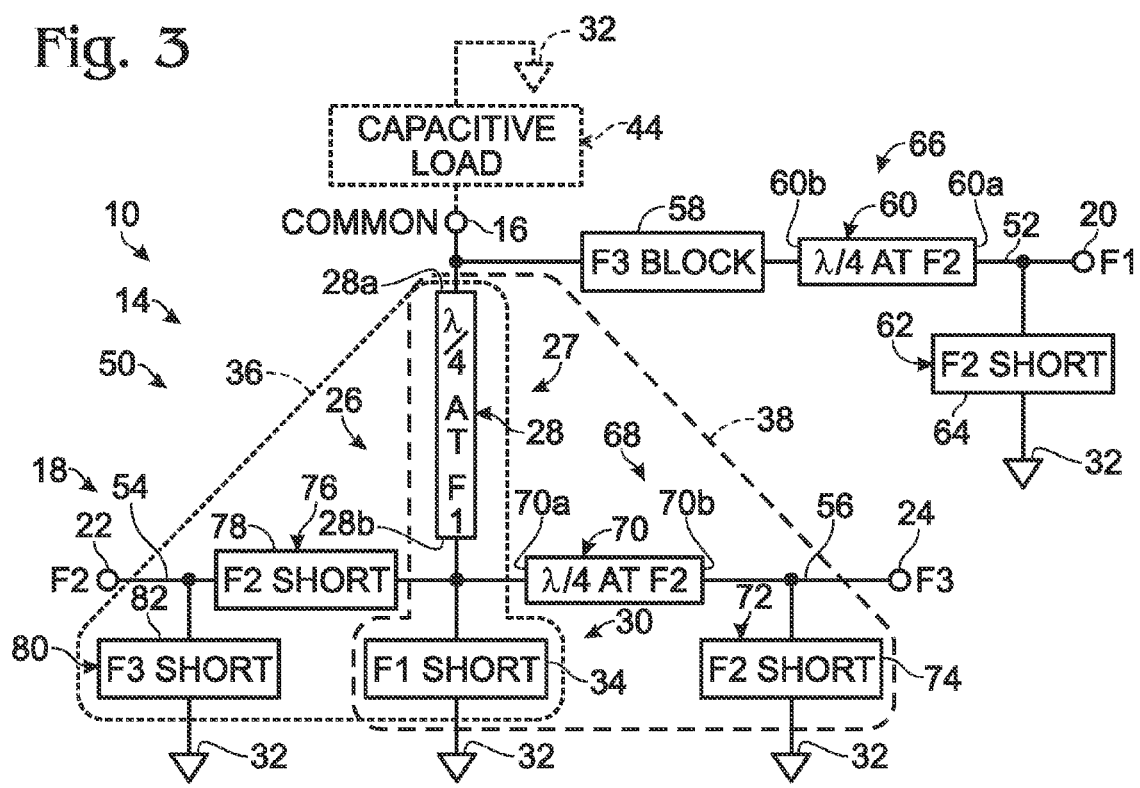

MERGED-FILTER MULTIPLEXER

BACKGROUND

As used in telecommunications, a frequency multiplexer (hereafter referred to simply as "multiplexer") is a network that separates signals from or to a common port to or from other ports, sorted according to their frequency. Frequency sorting is conventionally achieved by a filter in each signal line between the common port and another port, which filter allows the signal for the associated signal line to pass while attenuating the other signals. The filters generally may be low-pass, band-pass, or high-pass filters as appropriate.

Multiplexers may be used in a mixer for up-converting or down-converting signals in a radio-frequency transmitter or receiver. In such an application, the multiplexer may be a triplexer. Generally, a mixer performs frequency conversion by multiplying two signals. For example, in a receiver, a radio-frequency signal and a local-oscillator signal may be multiplied to produce an intermediate-frequency or baseband signal. (Baseband signals, for which there may be no lower frequency limit, will be considered intermediate-frequency signals for the purpose of this discussion.) Similarly, in a transmitter, an intermediate-frequency signal and a local-oscillator signal may be multiplied to produce a radio-frequency signal.

Isolation between the various signal lines is important. Conventionally, a low-pass filter may be used in the intermediate-frequency signal line to allow substantially only the intermediate-frequency signal to be conducted. A band-pass filter may be used in the local-oscillator signal line to attenuate intermediate- and radio-frequency signals. A band-pass or high pass filter may be used in the radio-frequency signal line to attenuate intermediate- and local-oscillator signals. Additionally, the signal path to a common terminal desirably has low impedance for the signals in each of the signal lines.

BRIEF SUMMARY

In some examples, a multiplexer circuit may include a common terminal for conducting a signal having a first frequency and a signal having a second frequency different from the first frequency, a first terminal for conducting the signal having the first frequency, and a second terminal for conducting a signal having the second frequency. The first terminal may be electrically coupled to the common terminal, and the second terminal may be electrically coupled to the second terminal. In some examples, a multiplexer may include a first transmission line having a first end coupled to the first terminal and a second end coupled to the second terminal, and a first low-impedance circuit electrically directly connecting the second end of the first transmission line to a circuit ground. The first transmission line may have an electrical length substantially equal to a quarter wavelength of the first frequency and a first characteristic impedance at the first frequency. The first low-impedance circuit may provide at the first frequency an impedance that is less than half of the first characteristic impedance. The series combination of the first transmission line and the first low-impedance circuit may provide at the first frequency a first high impedance to ground at the first end of the first transmission line.

In some examples, a second transmission line may have a first end coupled to the common terminal and a second end coupled to the first terminal, the second transmission line having an electrical length substantially equal to a quarter wavelength of the second frequency, and a second low-impedance circuit may electrically directly connect the second end of the second transmission line to the circuit ground wherein the second low-impedance circuit provides at the second frequency a second low impedance. The series combination of the second transmission line and the second low-impedance circuit may provide at the second frequency a second high impedance to ground at the first end of the second transmission line.

In some examples, a multiplexer circuit may include a third terminal for conducting a signal having a third frequency different from the first and second frequencies. A second transmission line may have a first end coupled to the second end of the first transmission line and a second end coupled to the third terminal, with the second transmission line having an electrical length substantially equal to a quarter wavelength of the second frequency. A second low-impedance circuit may electrically directly connect the second end of the second transmission line to the circuit ground, wherein the second low-impedance circuit provides at the second frequency a second low impedance. In such examples, the series combination of the second transmission line and the second low-impedance circuit may provide at the second frequency a second high impedance to ground at the first end of the second transmission line.

In some examples, a further low-impedance circuit may electrically couple the second terminal to the second end of the first transmission line wherein the further low-impedance circuit provides at the second frequency a second low impedance. In some examples, a yet further low-impedance circuit may electrically couple the second terminal to the circuit ground wherein the yet further low-impedance circuit provides at the third frequency a low impedance.

BRIEF DESCRIPTION OF THE DRAWINGS

FIG. 1 is a block diagram of a multiplexer circuit.

FIG. 2 is a block diagram similar to FIG. 1 of a mixer circuit.

FIG. 3 is a block diagram of a multiplexer circuit including the multiplexer circuit of FIG. 1.

DETAILED DESCRIPTION OF VARIOUS EMBODIMENTS

Figure 4:
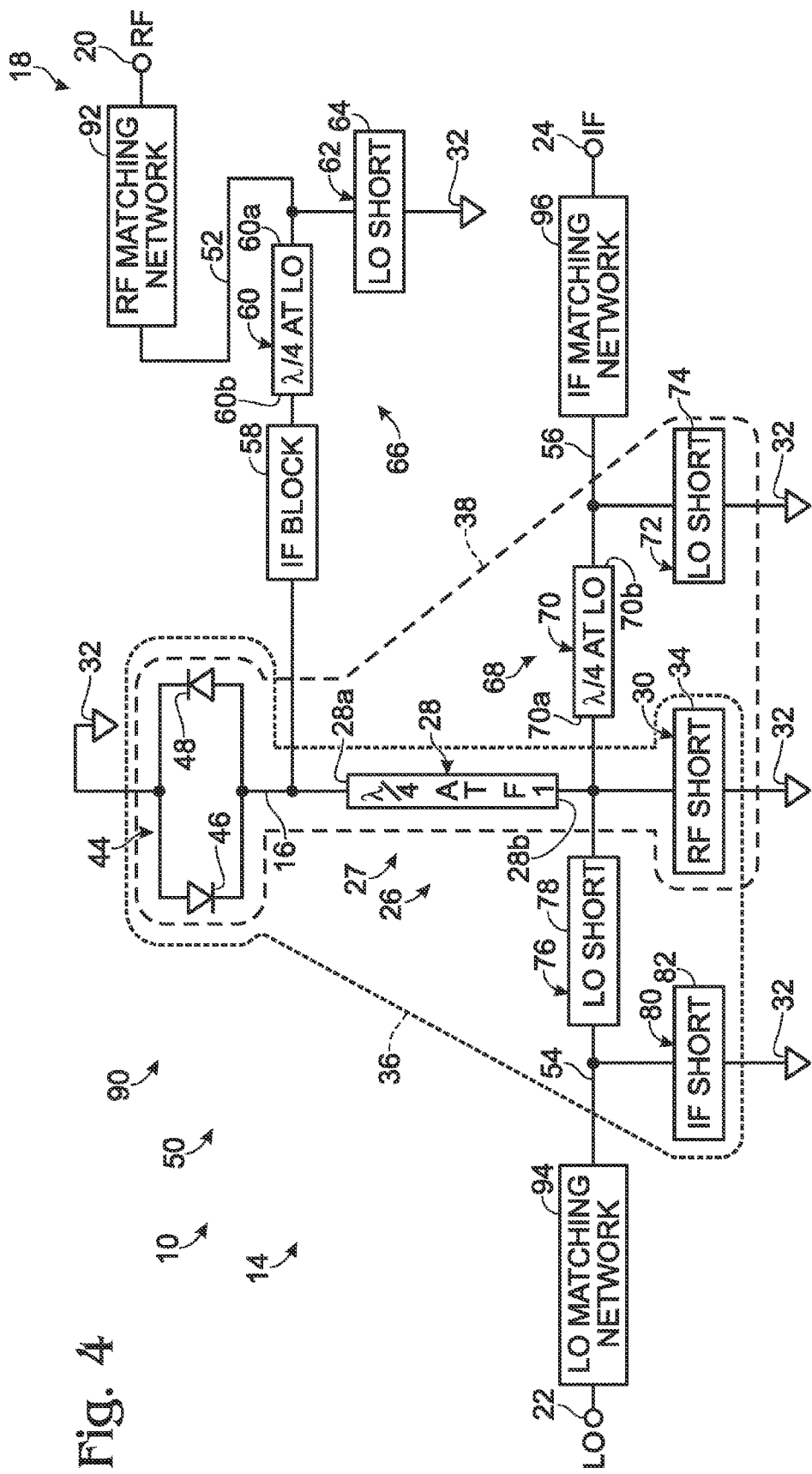
FIG. 4 is a block diagram of a mixer circuit including the multiplexer circuit of FIG. 3.

This description is illustrative and directed to examples of apparatus and/or method(s), and is not limited to any specific invention or inventions. The selected claims that are appended to this description define specific inventions included in the described apparatus and or methods. No single feature or element, or combination thereof, is essential to all possible combinations that may now or later be claimed.

As mentioned, a multiplexer is a network that separates signals from a common port to other ports, sorted according to frequency. Any number of other ports may be used. Referring to FIG. 1, a multiplexer 10 is shown. In this example, multiplexer 10 may be a diplexer 12 or a triplexer 14. A common port or terminal 16 and a plurality of separate signal ports or terminals 18 are shown. Separate signal terminals 18, in this example, may include a first signal terminal 20, a second signal terminal 22, and a third signal terminal 24. First terminal 20 may be for conducting a signal having a first frequency F1. Second terminal 22 may be for conducting a signal having a second frequency F2. Third terminal 24 may be for conducting a signal having a third frequency F3. Frequencies F1, F2, and F3 may all be different, and may be frequencies in non-overlapping frequency bands. As a diplexer 12, in addition to common terminal 16 multiplexer 10 may have only signal terminals 20 and 22 or only signal terminals 20 and 24.

Multiplexer 10 may provide isolation between first terminal 20 and terminals 22 and 24 by providing a high-impedance network 26 that, for signals having a frequency F1, consists of a low-impedance circuit 30 from terminals 22 and 24 to circuit ground 32 and an impedance-transforming network 27 between terminal 20 and terminals 22 and 24. In this example, impedance-transforming network 27 consists of a transmission line 28, and high-impedance network 26 may present at frequency F1 an impedance at terminal 20 that is more than twice the characteristic impedance of the associated transmission line 28. Circuit 30 may present at terminals 22 and 24 an impedance to circuit ground 32 that is less than one-half the characteristic impedance of transmission line 28. Transmission line 28 has a first end 28a coupled to terminal 20 and common terminal 16, and a second end 28b coupled to terminals 22 and 24. Transmission line 28 may have an electrical length equal to about a quarter of a wavelength ($\lambda$) of a signal having frequency F1. Transmission line 28 may have a characteristic impedance, such as 50 ohms.

A transmission line may be simple (formed of a single element) or compound (formed of plural elements). As used herein, a simple or real transmission line is the material medium or structure that forms all or part of a path from one place to another for directing the transmission of energy, such as electromagnetic waves, and which may be characterized by characteristic impedance, transmission-time delay, phase shift, and/or other parameter(s). A compound transmission line, also referred to as an artificial transmission line, may be a four-terminal electrical network that may have the characteristic impedance, transmission-time delay, phase shift, and/or other parameter(s) similar to a real transmission line and therefore can be used to emulate that of a real transmission line in one or more of these respects. Accordingly, transmission line 28 may be a simple or compound transmission line.

There are various ways that transmission lines may be implemented. Transmission lines may be a network of one or more sections of each of a simple transmission line (T), an inductor (L), and/or a capacitor (C). A few non-exclusive examples of transmission lines include series (in signal line) T; series L-shunt (to ground) C-series L; shunt C-series L-shunt C; series T-shunt C-series T; shunt C-series T-shunt C; and series L-shunt T-series L. Other networks may also be used.

Low-impedance circuit 30 may have low impedance for a signal having a frequency F1. Circuit 30 has low impedance relative to the characteristic impedance of an associated transmission line, such as in this case, transmission line 28. For example, low-impedance may be impedance that is less than one-half of the characteristic impedance of transmission line 28.

As is well known, a transmission line that is electrically an odd number of quarter wavelengths long terminated in an impedance $Z_{LOAD}$ at the far end presents an input impedance $Z_{IN}=Z_0^2/Z_{LOAD}$. Thus, the smaller $Z_{LOAD}$ is, the larger $Z_{IN}$ is. If $Z_{LOAD}$ is effectively a short at a given frequency, then the combination of the transmission line and the short will effectively appear to be an open circuit at the input end. Thus, to produce higher impedance at common terminal 16, low-impedance circuit 30 may be a short circuit 34.

A short circuit is a circuit producing a relatively low impedance between two points of different potential in a circuit, and ideally has zero impedance. When the term is used in association with a related transmission line having a characteristic impedance at a given frequency, a short-circuit impedance may be considered to be an impedance that is less than ten percent of the characteristic impedance at the given frequency.

To the extent that a signal having a frequency F1 reaches transmission line end 28b, low-impedance circuit 30 provides a low-impedance path to ground. The closer circuit 30 is to a short circuit at frequency F1, the less that signals having a frequency F1 will be conducted to terminals 22 and 24. This short brings the F1-signal voltage down to zero at the junction of the frequency F2 line, shown as terminal 22, and the frequency F3 line, shown as terminal 24, thereby preventing any frequency F1 signal from reaching frequency F2 and frequency F3 terminals 22 and 24.

A low-impedance circuit, including a short circuit, may be a network of any configuration of one or more of each of a transmission line (T), a capacitor (C) and an inductor (L) suitable for providing a desired impedance. Examples include the following series combinations: T-L-T-C-T; L-C-T; L-T-C; T-L-C; L-C; and C-L. Shunt circuits to ground may also include combinations ending in an open-ended transmission-line stub, such as T ($\lambda$/4); L-T; L-(T//(parallel to) C to ground), T-L-T; C-L-T; and L-C-T.

High-impedance network 26 may also be considered to be a merged filter 36 in that it filters out frequency F1 signals in the common-signal path for both frequency F2 and frequency F3 signals. Transmission line 28 and low-impedance circuit 30 may also function as parts of a compound transmission line 36 for frequency F2 signals and/or as a transmission line 38 for frequency F3 signals. That is, transmission line 28 may provide series inductance, and low-impedance circuit 30 may provide shunt capacitance for these signals.

It is seen that multiplexer 10 comprises a common terminal 16 for conducting a signal having a first frequency F1 and a signal having a second frequency F2 or F3 different from the first frequency F1; a first terminal 20 for conducting the signal having the first frequency F1, the first terminal 20 being electrically coupled to the common terminal 16; a second terminal 22 or 24 for conducting a signal having a second frequency F2 or F3, the second terminal 22 or 24 being electrically coupled to the common terminal 16; a first transmission line 28 having a first end 28a coupled to the first terminal 20 and a second end 28b coupled to the second terminal 22 or 24, the first transmission line 28 having an electrical length substantially equal to a quarter wavelength of the first frequency F1 and a first characteristic impedance at the first frequency F1; and a first low-impedance circuit 30 electrically directly connecting the second end 28b of the first transmission line 28 to a circuit ground 32, the first low-impedance circuit 30 providing at the first frequency F1 an impedance that is less than half of the first characteristic impedance, and the series combination of the first transmission line 28 and the first low-impedance circuit 30 providing at the first frequency F1 a high impedance to ground 32 at the first end 28a of the first transmission line 28.

FIG. 2 illustrates an example of multiplexer 10, in the form of a triplexer 40 suitable for use in a mixer 42. Elements in common with multiplexer 10 are assigned the same reference numbers as for multiplexer 10. The description of these elements with regard to FIG. 1 applies to triplexer 40. In this embodiment, frequency F1 is a radio frequency (RF), frequency F2 is a local-oscillator (LO) frequency, and frequency F3 is an intermediate frequency (IF). As a further example, for an E-band second-harmonic mixer, the RF signal may be in the range of 71 to 95 GHz, the LO signal may be in the range of 27 to 48 GHz, and the IF signal may be in the range of 1 to 16 GHz.

Triplexer 40 may include a terminating network 44 connecting common terminal 16 to circuit ground 32. Terminating network 44 may provide suitable impedance to ground, such as a low impedance or short circuit. In this example, network 44 includes diodes 46 and 48 connected in parallel. These diodes are oppositely connected to provide signal conduction in both directions. Diodes 46 and 48 may provide parasitic capacitance to ground at lower frequencies, or inductance or resistance at higher frequencies.

Other terminating networks may also be provided. For example, an RF filter or an IF filter may also be located between the common terminal 16 and circuit ground 32 in multiplexer 10 shown in FIG. 1, or such as between the diode circuit and circuit ground in FIG. 2. As such, the side of the diode pair connected to common terminal 16 may electrically function as a ground at the pass frequency of the filter connected to the other side of the diode pair. Also, a single diode, a diode ring, or a switch network may be used, as is well known.

As with multiplexer 10 illustrated in FIG. 1, high-impedance network 26 may include transmission line 28 having an electrical length of $\lambda/4$ at radio frequency and low-impedance circuit 30. The high-impedance network may provide high impedance to ground at end 28a of the transmission line. If circuit 30 is a short circuit 34, then the high-impedance network 26 appears as an open circuit at radio frequency.

FIG. 3 illustrates a block diagram of an example of multiplexer 10 in the form of a triplexer 50 that includes triplexer 14. Triplexer 50 thus may include common terminal 16 and signal terminals 18, including frequency-F1 signal terminal 20, frequency-F2 signal terminal 22, and frequency-F3 signal terminal 24. A high-impedance network 26 may include transmission line 28, with ends 28a and 28b, and frequency-F1 low-impedance circuit 30, which may be in the form of a short circuit 34, coupled to circuit ground 32. Terminating network 44, which may be a capacitive load, may be coupled to circuit ground 32.

Additionally, triplexer 50 may include a first-frequency signal line 52 coupling signal terminal 20 to common terminal 16, a second-frequency line 54 coupling signal terminal 22 to common terminal 16, and a third-frequency line 56 coupling signal terminal 24 to common terminal 16. Signal line 52 may include a frequency-F3-blocking circuit 58 in series with a transmission line 60. Blocking circuit 58 may be coupled to common terminal 16. This blocking circuit may be any circuit or network appropriate to block signals having a frequency F3, while allowing transmission of signals having a frequency F1. A blocking circuit may be as simple as a capacitor or something more complex, such as an inductor in parallel with a capacitor to form a resonator.

In this example, transmission line 60 has an end 60a coupled to terminal 20, and may have an electrical length about equal to a quarter of a wavelength of a signal having a frequency F2. End 60a is coupled to circuit ground 32 by a low-impedance circuit 62. Low-impedance circuit 62 may be a short circuit 64 at frequency F2. Transmission line 60 and low-impedance circuit 62 may form a high-impedance network 66. Similar to network 26, network 66 may provide high impedance at a second end 60b of transmission line 60 to signals having a frequency F2. Also similarly to low-impedance circuit 30, low-impedance circuit 62 may provide low impedance to ground, such as a short circuit 64, for signals having a frequency F2.

Blocking circuit 58 thus attenuates or even blocks signals having a frequency of F3 from getting to terminal 20, and high-impedance network 66 attenuates or blocks signals having a frequency of F2 from getting to terminal 20.

It is seen that triplexer 50, as a form of multiplexer 10, further comprises a second transmission line 60 having a first end 60b coupled to the common terminal 16 and a second end 60a coupled to the first terminal 20, the second transmission line 60 having an electrical length substantially equal to a quarter wavelength of the second frequency F2; and a second low-impedance circuit 62 electrically directly connecting the second end 60a of the second transmission line 60 to the circuit ground 32, the second low-impedance circuit 62 providing at the second frequency F2 a second low impedance, and the series combination of the second transmission line 60 and the second low-impedance circuit 62 providing at the second frequency F2 a second high impedance to ground at the first end 60b of the second transmission line 60.

Triplexer 50 may also include a third high-impedance network 68 that includes a transmission line 70 and a low-impedance circuit 72. In this example, a first end 70a of transmission line 70 is connected to second end 28b of transmission line 28, the third transmission line 70 also having an electrical length substantially equal to a quarter wavelength of the second frequency F2. Low-impedance circuit 72 electrically directly connects a second end 70b of the transmission line 70 to the circuit ground 32. Low-impedance circuit 72 may provide low impedance at the second frequency F2. If the impedance is low enough, circuit 72 may be a short circuit 74 at second frequency F2. The series combination of the second transmission line 70 and low-impedance circuit 72 may provide at the second frequency F2 high impedance to ground at the first end 70a of transmission line 70.

Triplexer 50 may also be configured so that low-impedance circuits 30 and 72 provide capacitive impedance to ground at the third frequency F3 and transmission lines 28 and 70 provide inductive impedance at the third frequency F3. Low-impedance circuits 30 and 72 and transmission lines 28 and 70 thereby form in combination transmission line 38 at third frequency F3. When terminating network 44 is a capacitive load at frequency F3, terminating network 44 may also form part of transmission line 38.

A series low-impedance circuit 76 may be disposed in signal line 54 between second end 28b of transmission line 28 and second terminal 22, as shown. Low-impedance circuit 76 may provide low impedance at the second frequency F2. If the impedance is low enough, circuit 76 may be a short circuit 78 at second frequency F2.

A low-impedance circuit 80 may electrically directly connect signal line 54, between second terminal 22 and circuit 76, to the circuit ground 32. Low-impedance circuit 80 may provide low impedance at the second frequency F2. If the impedance is low enough, circuit 72 may be a short circuit 82 at second frequency F2.

Triplexer 50 may also be configured so that low-impedance circuits 30 and 80 are configured to provide capacitive impedance to ground at the second frequency F2, and series low-impedance circuit 76 and transmission line 28 may be configured to provide inductive impedance at the second frequency F2. Low-impedance circuits 30, 76, and 80 and transmission line 28 may form in combination transmission line 36 between second terminal 22 and common terminal 16 at second frequency F2. A capacitive load provided by terminating network 44 may also form part of transmission line 36.

Figure 5:
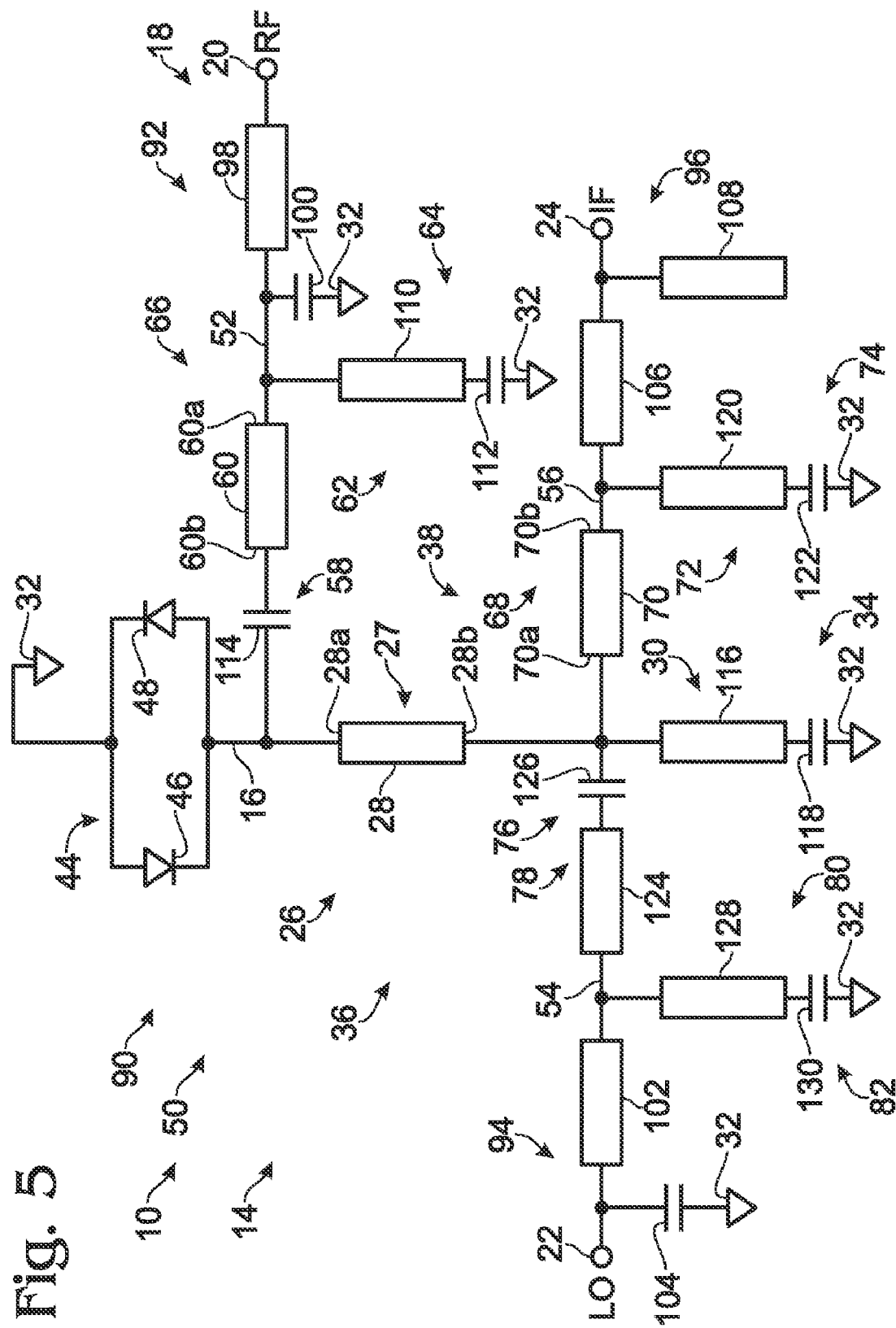
FIG. 5 is a circuit schematic of an embodiment of the mixer circuit of FIG. 4.
Figure 6:
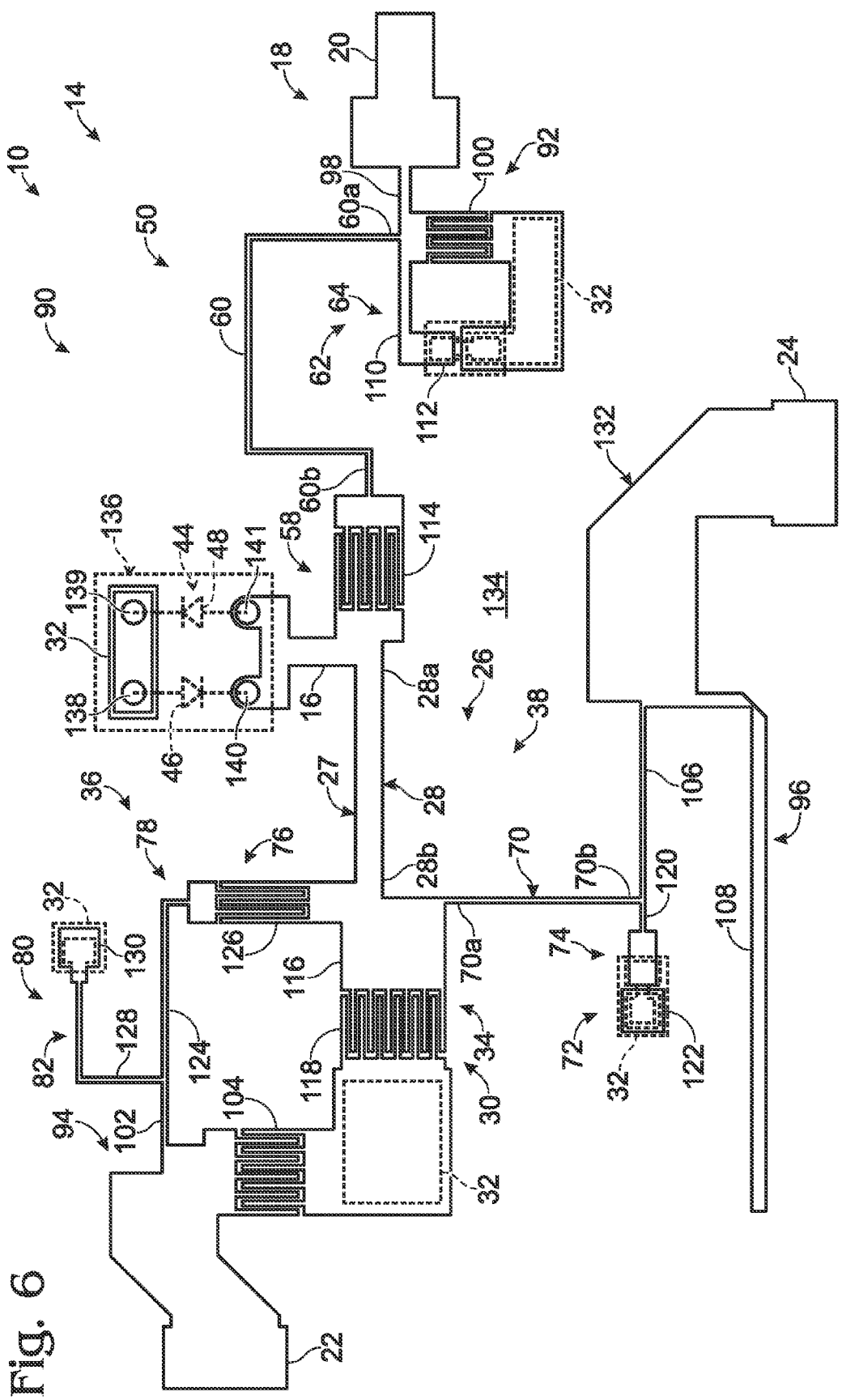
FIG. 6 is a simplified plan view of an exemplary layout of the mixer of FIG. 5.

FIGS. 4-6 illustrate a mixer 90 as an example of multiplexer 10 and/or triplexer 50. FIG. 4 is a block diagram, and FIG. 5 is a circuit schematic. FIG. 6 is a simplified plan view showing an exposed mask layer of an E-band harmonic mixer 90 fabricated with the triplexer architecture described. As discussed previously with regard to multiplexer 10 and triplexer 50, mixer 90 may include common terminal 16, signal terminals 18, including frequency-F1 signal terminal 20, frequency-F2 signal terminal 22, and frequency-F3 signal terminal 24, signal lines 52, 54, and 56, transmission lines 28, 36, 38, 60, and 70, low-impedance circuits 30, 62, 72, 76, and 80, short circuits 34, 64, 74, 78, and 82, high-impedance circuits 26, 66, and 68, terminating network 44, including diodes 46 and 48, blocking circuit 58, and circuit ground 32. The previous descriptions of these features apply with frequencies F1, F2, and F3 corresponding respectively to radio frequency (RF), local-oscillator frequency (LO), and intermediate frequency (IF). Transmission lines 28, 60, and 70 have respective ends 28a, 28b, 60a, 60b, 70a, and 70b, as discussed previously.

In addition, at each terminal there may be an impedance-matching network to match the impedance of the associated signal line with the impedance of the associated external circuit, not shown. Each matching network may be any network of transmission lines, inductances, and capacitances that provide the desired impedance. Specifically, an RF matching network 92 in signal line 52 is connected to RF terminal 20; an LO matching network 94 in signal line 54 is connected to LO terminal 22; and an IF matching network 96 in signal line 56 is connected to IF terminal 24.

In this example, as particularly shown in FIGS. 5 and 6, matching network 92 includes a series transmission line 98 connected to terminal 20. A shunt capacitor 100 connects the junction between transmission lines 60 and 98 to ground 32. Matching network 94 includes a series transmission line 102 connected to terminal 22. A shunt capacitor 104 connects to ground the junction between transmission line 102 and terminal 22, as shown. Matching network 96 includes a series transmission line 106 connected to terminal 24. A shunt open-ended transmission-line stub 108 capacitively couples to ground the junction between transmission line 106 and terminal 24.

LO short circuit 64 includes a transmission line 110 in series with a capacitor 112 to ground. IF blocking circuit 58 includes a series capacitor 114. RF short circuit 34 includes a transmission line 116 and a capacitor 118 to ground. LO short circuit 74 includes a transmission line 120 and a capacitor 122 to ground. Series LO short circuit 78 includes a transmission line 124 in series with a capacitor 126 connected to the junction with IF signal line 56 between transmission line 28 and RF short circuit 34. IF short circuit 82 includes a transmission line 128 and a capacitor 130 to ground.

As shown in FIG. 6, capacitors 100, 104, 114, 118, and 126 are planar interdigitated capacitors. Capacitors 112, 122, and 130 are interlayer plate capacitors.

Generally referring to FIG. 6, mixer 90 may be formed with microstrip conductive traces 132 on and in a base dielectric substrate 134 including one or a plurality of layers and a backside ground plane, as is well known. In the embodiment shown, multiple layers of conductors connected by vias are used. Monolithic circuit structures, printed circuit boards, and other architectures may be used, as are also well known. In the structure shown, terminating network 44 may be provided as a flip chip 136 mounted on corresponding bonding pads 138, 139, 140, and 141. Other terminating network configurations and architectures may be used. For example, the network may be provided with separate components each connected to associated pads or other terminals, such as by bond wires, and other conventional forms of mounting components may be used.

It will be appreciated that mixer 90 channels the LO input signal power to the common terminal while limiting the amount of LO power reaching the RF and IF terminals, channels the RF signal to or from the common terminal with limited loss and with limited RF signal power reaching the LO or IF terminals, and channels the IF signal to or from the common terminal with limited loss and with limited IF signal power reaching the LO or RF terminals.

The RF short brings the RF voltage down to nearly zero at the junction of the LO and IF lines, thereby limiting the amount of RF signal reaching the LO and IF terminals. As has been mentioned, transmission line 28, being a quarter wavelength long at the RF frequency, transforms the RF short impedance to a high impedance at the common terminal further reducing the amount of RF power reaching the junction between the LO and IF lines.

Similarly, the IF short on the LO line and the IF block on the RF line limit the amount of IF power reaching the LO and RF terminals. Furthermore, the LO short in series with the LO line may be configured to present a high impedance at the IF, further minimizing the leakage of IF into the LO terminal. Thus, IF signal power can flow between the IF terminal and the common terminal, but very little if any IF signal power presents itself at the LO and RF terminals.

The use of LO shorts on the RF and IF lines, as well as the associated use of transmission lines that are approximately a quarter wavelength long at the LO frequency, transform these shorts to high impedances to further reduce the LO power entering the RF and IF lines.

The IF short acts as a large inductance, and hence a high impedance, at the LO frequency. It therefore has little influence on transmission of the LO signal. The RF short acts as a capacitor to ground at the LO frequency, and the load on the common terminal (such as the diodes) can also present capacitance to ground. The LO short in series with the LO line and the quarter-wave line at RF can be adjusted to have the right amount of inductance to turn the network into a transmission line 36 for the LO band. This makes the LO match well over a wide bandwidth. An LO matching network may make further corrections to prevent LO signals from being reflected from the circuit and to help direct LO power into the common terminal.

Similarly, the LO short on the IF line, the RF short, and the capacitive load parasitics on the common terminal act as capacitors to ground in the IF path, and the inductance of the quarter-wave line for LO and the quarter-wavelength line at RF may be adjusted to turn the IF path to the common node into artificial transmission line 38 over the IF band. An additional IF matching network 96 can act to improve the match.

The LO short on the RF line may act as an inductor at the RF frequency, and it can be compensated by some parallel capacitance, such as capacitor 100, in the RF matching network 92 to provide a broadband transmission line for RF signals from the RF terminal to the common terminal.

The matching networks can be implemented in many ways, but a simple way includes an inductance in series with the signal path and a capacitance from the signal path to ground. The capacitance can be on either side of the inductor, depending on the impedance to be matched.

The circuit may be adjusted to support the particular application in which it is to be used. Once the initial design is set, the circuit can be optimized with a circuit simulator to achieve desired performance goals over the prescribed RF, LO, and IF bands. The shorts, blocks, and transmission lines as optimized may deviate somewhat from their namesakes over the various frequency bands, but the circuit architecture will be basically intact.

The above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled. Accordingly, while embodiments of multiplexers and mixers, and associated methods of multiplexing signals have been particularly shown and described, many variations may be made therein. This disclosure may include one or more independent or interdependent inventions directed to various combinations of features, functions, elements, and/or properties, one or more of which may be defined in the following claims. Other combinations and sub-combinations of features, functions, elements, and/or properties may be claimed later in this or a related application. Such variations, whether they are directed to different combinations or directed to the same combinations, whether different, broader, narrower, or equal in scope, are also regarded as included within the subject matter of the present disclosure. An appreciation of the availability or significance of claims not presently claimed may not be presently realized. Accordingly, the foregoing embodiments are illustrative, and no single feature or element, or combination thereof, is essential to all possible combinations that may be claimed in this or a later application. Each claim defines an invention disclosed in the foregoing disclosure, but any one claim does not necessarily encompass all features or combinations that may be claimed. Where the claims recite "a" or "a first" element or the equivalent thereof, such claims include one or more such elements, neither requiring nor excluding two or more such elements. Further, ordinal indicators, such as first, second, or third, for identified elements are used to distinguish between the elements, and do not indicate a required or limited number of such elements, and do not indicate a particular position or order of such elements unless otherwise specifically stated.

INDUSTRIAL APPLICABILITY

The methods and apparatus described in the present disclosure are applicable to telecommunications and other industries utilizing signal processing.

The invention claimed is:

1. A multiplexer circuit comprising:
   a common terminal for conducting a first signal having a first frequency and a second signal having a second frequency different from the first frequency;
   a first terminal for conducting the first signal, the first terminal being electrically coupled to the common terminal;
   a second terminal for conducting the second signal, the second terminal being electrically coupled to the common terminal;
   a first transmission line having a first end coupled to the first terminal and a second end coupled to the second terminal, the first transmission line having an electrical length substantially equal to a quarter wavelength of the first frequency and a first characteristic impedance at the first frequency; and
   a first low-impedance circuit electrically directly connecting the second end of the first transmission line to a circuit ground, the first low-impedance circuit providing at the first frequency an impedance that is less than half of the first characteristic impedance, and the first transmission line and the first low-impedance circuit in series combination together providing at the first frequency a first high impedance to the circuit ground at the first end of the first transmission line.

2. The multiplexer circuit according to claim 1, wherein the first low-impedance circuit is a short circuit at the first frequency.

3. The multiplexer circuit according to claim 1, further comprising:
   a second transmission line having a first end coupled to the common terminal and a second end coupled to the first terminal, the second transmission line having an electrical length substantially equal to a quarter wavelength of the second frequency; and
   a second low-impedance circuit electrically directly connecting the second end of the second transmission line to the circuit ground, the second low-impedance circuit providing at the second frequency a second low impedance, and the second transmission line and the second low-impedance circuit in series combination together providing at the second frequency a second high impedance to the circuit ground at the first end of the second transmission line.

4. The multiplexer circuit according to claim 3, wherein the second low-impedance circuit is a short circuit at the second frequency.

5. The multiplexer circuit according to claim 1, further comprising:
   a third terminal for conducting a third signal having a third frequency;
   a second transmission line having a first end coupled to the second end of the first transmission line and a second end coupled to the third terminal, the second transmission line having an electrical length substantially equal to a quarter wavelength of the second frequency; and
   a second low-impedance circuit electrically directly connecting the second end of the second transmission line to the circuit ground, the second low-impedance circuit providing at the second frequency a second low impedance, and the second transmission line and the second low-impedance circuit in series combination together providing at the second frequency a second high impedance to the circuit ground at the first end of the second transmission line.

6. The multiplexer circuit according to claim 5, wherein the second low-impedance circuit is a short circuit at the second frequency.

7. The multiplexer circuit according to claim 5, wherein the first and second low-impedance circuits provide capacitive impedance to the circuit ground at the third frequency and the first and second transmission lines provide inductive impedance at the third frequency, whereby the first and second low-impedance circuits and the first and second transmission lines form in combination a third transmission line at the third frequency.

8. The multiplexer circuit according to claim 7, further comprising a capacitive load coupled to the common terminal, whereby the first and second low-impedance circuits, the first and second transmission lines, and the capacitive load form in combination the third transmission line at the third frequency.

9. The multiplexer circuit according to claim 1, further comprising:
   a third terminal coupled to the second end of the first transmission line for conducting a third signal having a third frequency different from the first and second frequencies;
   a second low-impedance circuit electrically coupling the second terminal to the circuit ground, the second low-impedance circuit providing at the third frequency a second low impedance to the circuit ground.

10. The multiplexer circuit according to claim 9, further comprising a third low-impedance circuit electrically coupling the second terminal to the second end of the first transmission line, the third low-impedance circuit providing at the second frequency a third low impedance between the second terminal and the second end of the first transmission line.

11. The multiplexer circuit according to claim 10, wherein the first and second low-impedance circuits are configured to provide capacitive impedance to the circuit ground at the second frequency, and the third low-impedance circuit and the first transmission line are configured to provide an inductive impedance at the second frequency, whereby the first, second, and third low-impedances and the first transmission line form in combination a second transmission line at the second frequency.

12. The multiplexer circuit according to claim 11, further comprising a capacitive load coupled to the common terminal, whereby the first, second, and third low-impedances, the first transmission line, and the capacitive load form in combination the second transmission line at the second frequency.

13. The multiplexer circuit according to claim 12, wherein the first frequency is higher than the second frequency and the second frequency is higher than the third frequency.

14. The multiplexer circuit according to claim 13, wherein the multiplexer circuit is an E-band mixer, and the first frequency is a radio frequency between about 71 GHz and 95 GHz, the second frequency is a local-oscillator frequency between about 27 GHz and 48 GHz, and the third frequency is an intermediate frequency between about 1 GHz and 16 GHz.

15. The multiplexer circuit according to claim 1, further comprising a second low-impedance circuit electrically coupling the second terminal to the second end of the first transmission line, the second low-impedance circuit providing at the second frequency a second low impedance between the second terminal and the second end of the first transmission line.

16. The multiplexer circuit according to claim 15, wherein the first low-impedance circuit is configured to provide capacitive impedance to the circuit ground at the second frequency, and the second low-impedance circuit and the first transmission line are configured to provide inductive impedance at the second frequency, whereby the first and second low-impedances and the first transmission line form in combination a transmission line between the second terminal and the common terminal at the second frequency.

17. A multiplexer circuit comprising:
a common terminal for conducting first, second and third signals having respective first, second and third different frequencies;
a first terminal for conducting the first signal, the first terminal being electrically coupled to the common terminal;
a second terminal for conducting the second signal, the second terminal being electrically coupled to the common terminal;
a third terminal for conducting the third signal, the third terminal being electrically coupled to the common terminal;
a first transmission line having a first end coupled to the first terminal and a second end coupled to the second terminal, the first transmission line having an electrical length substantially equal to a quarter wavelength of the first frequency and a first characteristic impedance at the first frequency;
a first short circuit electrically directly connecting the second end of the first transmission line to a circuit ground wherein the first short circuit is a short circuit at the first frequency, and the first transmission line and the first short circuit in series combination together providing at the first frequency a first high impedance to the circuit ground at the first end of the first transmission line;
a second transmission line having a first end coupled to the common terminal and a second end coupled to the first terminal, the second transmission line having an electrical length substantially equal to a quarter wavelength of the second frequency;
a second short circuit electrically directly connecting the second end of the second transmission line to the circuit ground wherein the second short circuit is a short circuit at the second frequency, the second transmission line and the second short circuit in series combination together providing at the second frequency a second high impedance to the circuit ground at the first end of the second transmission line;
a third transmission line having a first end coupled to the second end of the first transmission line and a second end coupled to the third terminal, the third transmission line having an electrical length substantially equal to a quarter wavelength of the second frequency;
a third short circuit electrically directly connecting the second end of the second transmission line to the circuit ground wherein the third short circuit is a short circuit at the second frequency, the third transmission line and the third short circuit in series combination together providing at the second frequency a third high impedance to the circuit ground at the first end of the third transmission line;
a fourth short circuit electrically coupling the second terminal to the second end of the first transmission line wherein the fourth short circuit is a short circuit at the second frequency; and
a fifth short circuit electrically coupling the second terminal to the circuit ground wherein the fifth short circuit is a short circuit at the third frequency.

18. The multiplexer circuit according to claim 17, further comprising a capacitive load coupled to the common terminal; and wherein the first and third short circuits are configured to provide capacitive impedance to the circuit ground at the third frequency, and the first and second transmission lines provide inductive impedance at the third frequency, whereby the first and third short circuits, the first and third transmission lines, and the capacitive load form in combination a transmission line at the third frequency; and the first and fifth short circuits are further configured to provide capacitive impedances to the circuit ground at the second frequency, and the fourth short circuit and the first transmission line are configured to provide inductive impedance at the second frequency, whereby the first, fourth, and fifth short circuits and the first transmission line form in combination a transmission line between the second terminal and the common terminal at the second frequency.

19. The multiplexer circuit according to claim 18, wherein the first frequency is higher than the second frequency and the second frequency is higher than the third frequency.

20. The multiplexer circuit according to claim 19, wherein the multiplexer circuit is an E-band mixer, and the first frequency is a radio frequency between about 71 GHz and 95 GHz, the second frequency is a local-oscillator frequency between about 27 GHz and 48 GHz, and the third frequency is an intermediate frequency between about 1 GHz and 16 GHz.

* * * * *